US008884709B2

(12) United States Patent
Badets et al.

(10) Patent No.: US 8,884,709 B2
(45) Date of Patent: Nov. 11, 2014

(54) DOUBLE-POINT MODULATOR WITH ACCURATE AND FAST GAIN CALIBRATION

(75) Inventors: Franck Badets, Voiron (FR); Serge Ramet, Jarrie (FR); Michel Ayraud, Voreppe (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 62 days.

(21) Appl. No.: 13/547,594

(22) Filed: Jul. 12, 2012

(65) Prior Publication Data

US 2013/0015892 A1 Jan. 17, 2013

(30) Foreign Application Priority Data

Jul. 13, 2011 (FR) ...................................... 11 56435

(51) Int. Cl.
*H03C 3/06* (2006.01)
*H03C 3/09* (2006.01)

(52) U.S. Cl.
CPC ................................... *H03C 3/0908* (2013.01)
USPC ........... 331/128; 332/127; 332/119; 332/120; 332/123; 331/1 A; 331/16; 331/175; 331/183

(58) Field of Classification Search
CPC ..................................................... H03C 3/095
USPC ............ 331/1 A, 175, 16, 183; 332/127, 128, 332/119, 120, 123
See application file for complete search history.

(56) References Cited

U.S. PATENT DOCUMENTS

| 6,670,861 | B1 | 12/2003 | Balboni |
| 7,157,985 | B2 * | 1/2007 | Mitani et al. ................... 332/119 |
| 7,352,249 | B2 * | 4/2008 | Balboni et al. ................... 331/16 |
| 7,755,439 | B2 | 7/2010 | Yu et al. |
| 2004/0036539 | A1 | 2/2004 | Hammes et al. |
| 2005/0242889 | A1 | 11/2005 | Mitani et al. |
| 2010/0066459 | A1 | 3/2010 | Ahn |

OTHER PUBLICATIONS

Yu et al., "A 0.65-V 2.5-GHz Fractional-N Synthesizer With Two-Point 2-Mb/s GFSK Data Modulation," IEEE Journal of Solid-State Circuits, vol. 44, No. 9, Sep. 2009, pp. 2411-2425.

* cited by examiner

*Primary Examiner* — Arnold Kinkead
(74) *Attorney, Agent, or Firm* — Allen, Dyer, Doppelt, Milbrath & Gilchrist, P.A.

(57) ABSTRACT

A phase-locked loop double-point modulator may include a frequency divider having a ratio which can be changed by a first modulation signal, and an oscillator, a frequency of which can be changed by a second modulation signal correlated to the first modulation signal. A calibration circuit may be configured, in a calibration mode, to match the gains of the first and second modulation signals based on frequency measurements of the oscillator for two different calibration values of the second modulation signal. The phase-locked double-point modulator may also include an attenuator having a constant ratio greater than 1 and placed in the path of the second modulation signal, and a selector switch configured to be controlled by the calibration circuit to reduce the ratio of the attenuator in the calibration mode.

12 Claims, 2 Drawing Sheets

DOUBLE-POINT MODULATOR WITH ACCURATE AND FAST GAIN CALIBRATION

FIELD OF THE INVENTION

The present invention relates to the modulation of signals to be sent on a carrier, and, more particularly, to a so-called "double-point" modulator.

BACKGROUND OF THE INVENTION

FIG. 1 schematically represents a classic double-point modulator, as described in U.S. patent application publication No. 2010/0066459. More particularly, the classic double-point modulator includes a phase-locked loop designed to synthetize the carrier frequency using a reference frequency Fref.

The loop comprises a voltage-controlled oscillator VCO producing a signal Fout, the central frequency of which is set to the desired carrier frequency. The signal Fout feeds a programmable divider DIV. A phase comparator 10 receives the reference frequency Fref and the output of the divider DIV. The output of the phase comparator 10 is provided as a setpoint of the oscillator VCO through a low-pass filter 12.

The carrier frequency is determined by a digital signal Fc provided to a sigma-delta modulator SDM, the output of which sets the average division ratio of the divider DIV. The output of the modulator SDM can be coded on one or more bits. If it is coded on one bit, this bit selects a division ratio of N or N+1, where N is an integer. Thus, the central frequency of the signal Fout can be chosen between NFref and (N+1) Fref. If the output of the modulator SDM is coded on several bits, these bits select one of several consecutive integers comprising N.

The "double-point" modulation is performed using two correlated modulation signals that respectively modulate the carrier frequency Fc setpoint at the input of the sigma-delta modulator SDM and the setpoint of the oscillator VCO at the output of the filter 12.

Originally, the modulation signal MW is digital. It is added by an adder 14 to the digital carrier Fc setpoint at the input of the sigma-delta modulator SDM. However, the oscillator VCO requires an analog control signal. Thus, a digital-to-analog converter DAC producing an analog modulation signal m from the signal MW is provided. The signal m is added by an adder 16 to the output of the filter 12 at the control input of the oscillator VCO.

In a simpler "single-point" modulator, the modulation signal only acts on the division ratio of the divider DIV. However, the bandwidth of the modulation is then limited by the low-pass filter 12, which is used to remove the high-frequency noise generated by the sigma-delta modulator.

The transfer function applied to the modulation seen from the divider DIV acts as a low-pass filter while that applied to the modulation seen from the converter DAC acts as a high-pass filter. If the sum of these two transfer functions is equal to a constant, the bandwidth of the modulator is infinite. This condition is achieved when the respective gains of the modulation paths passing through the divider DIV and the converter DAC are identical.

It may be desirable to therefore match the gains of the two paths. One difficulty lies in the fact that these paths are made up of functional elements of different nature. Another difficulty is that the path through the converter DAC is analog, whereas the one passing through the divider DIV is digital.

To address this difficulty, the abovementioned patent application suggests a control circuit CTRL which sets the gain of the analog modulation signal m during an open-loop calibration phase. The gain can be set by a signal g, which determines the reference of the digital-to-analog converter DAC.

During a calibration phase, determined by the activation of a signal Cal, the loop is opened using a selector switch S1 placed between the phase comparator 10 and the filter 12. The central frequency of the oscillator VCO is then fixed and determined by the value reached at the output of the filter 12, which remains stored in a capacitive element of the filter. The control circuit CTRL applies an initial gain g to the converter DAC, such as an average value preprogrammed in the circuit. Two calibration values of the digital modulation signal MW are applied successively. For each calibration value, the circuit CTRL measures the resulting frequency of the signal Fout. The circuit then calculates a new gain g according to the initial gain and to the ratio of the difference in the frequencies measured to the difference in the calibration values.

The frequency measurement is based on counting the number of pulses of the signal Fout over a sufficient number of periods of the signal Fref. Such a count produces an integer accurate to within one unit by default. If the accuracy is not satisfactory, the number of periods of the signal Fref over which pulses are counted could be increased. However, given that a calibration must generally be done every time the carrier frequency Fc changes, the calibration duration compared to the useful modulation duration would increase to an unacceptable extent in certain applications, particularly for Bluetooth transmission in which the carrier frequency changes regularly during use ("frequency hopping").

To improve the accuracy while limiting the counting duration, the abovementioned patent application suggests a method for estimating the fractional part of the count using a decimation filter which calculates the average of counts over the periods of the signal Fref. The accuracy of this method depends on the number of periods of the signal Fref, and thus, on the counting duration.

SUMMARY OF THE INVENTION

It may be desirable for double-point modulators, achieving relatively good compromises in terms of accuracy and stabilization speed, to meet recent transmission standards. To address this, a phase-locked loop double-point modulator comprising a frequency divider, the ratio of which can be changed by a first modulation signal, is provided. The phase-locked loop double-point modulator also includes an oscillator, the frequency of which can be changed by a second modulation signal correlated to the first one. A calibration circuit is configured, in a calibration mode, to match the gains of the first and second modulation signals, based on frequency measurements of the oscillator in an open loop for two different calibration values of the second modulation signal. The a phase-locked loop double-point modulator further comprises an attenuator with a constant ratio greater than 1, placed in the path of the second modulation signal, and a selector switch controlled by the calibration circuit to reduce the ratio of the attenuator in the calibration mode.

According to one embodiment, the modulator comprises a digital-to-analog converter producing the second modulation signal, in analog form, from the first modulation signal, in digital form. The digital-to-analog converter is configured to produce an output deviation higher than the deviation necessary in a normal operating mode.

According to one embodiment, the ratio of the attenuator is chosen to adapt the output deviation of the digital-to-analog converter to the normal operating mode. According to one embodiment, the attenuator is a resistor bridge, and the selector switch is connected to sample the second modulation signal on the intermediate point of the resistor bridge, in the normal mode, and at the input of the resistor bridge, in the calibration mode.

A double-point modulation method is also provided using a phase-locked loop controlled by first and second correlated modulation signals acting respectively in a frequency divider and a controlled oscillator. The method includes opening the loop to switch to a calibration mode, and successively applying two different calibration values as second modulation signal and measuring the resulting frequencies produced by the oscillator. The method also includes determining a gain to be applied to the second modulation signal according to the difference in the measured frequencies, and attenuating the second modulation signal by a constant ratio greater than 1 in a normal operating mode in closed loop. The method further includes reducing the attenuation ratio in the calibration mode.

DETAILED DESCRIPTION OF THE PREFERRED EMBODIMENTS

Some embodiments will be presented in the following description, in relation with, but not limited to, the figures. Similar to U.S. patent application publication No. 2010/0066459, the present embodiments use a double-point modulator whose gain calibration is performed in an open loop by measuring frequencies for two calibration values of the modulation signal. However, this is the only point in common between the present embodiments and U.S. patent application publication No. 2010/0066459.

The gain to be applied to the analog modulation signal m (FIG. 1) is expressed, after the calibration phase, using the formula:

$$G=G_0 N_0/(N_2-N_1),$$

Where $G_0$ is the initial gain estimated and preprogrammed in the circuit, $N_1$ and $N_2$ the pulse counts obtained for the two calibration values of the modulation signal, and $N_o$ the target difference of the pulse counts. The target difference $N_0$ is obtained by applying the calibration values, in a closed loop, via the divider DIV, and considering the analog modulation signal m to be zero. As the calibration values are digital, the value $N_0$ can be calculated relatively accurately, insofar as the calibration values enable the convergence of the loop.

In these conditions, the maximum error made when calculating the gain may be expressed by $1/dF \cdot T$, where dF is the difference in the frequencies obtained for the two calibration values and T the counting period (multiple of 1/Fref). Thus, to reduce the error, T and dF can be increased. However, it may not be desirable to increase T, as this may extends the duration of the calibration.

It is desirable to increase dF. This implies using two calibration values of the modulation signal as far from each other as possible. For these values to be programmable and accurate, they are applied to the digital modulation signal MW. However, the calibration values desirable for use would exceed the input range of the digital-to-analog converter DAC that is designed to produce a modulation signal of low amplitude over the entire conversion range.

Here, the converter DAC is configured to have a global gain sufficiently high to produce an analog signal, the deviation of which is compatible with the desired calibration values. In the calibration mode, the output of the converter is applied directly to the oscillator VCO. In the normal operating mode, the deviation of the analog signal would be too high. So, a constant ratio attenuator is used, that is chosen to bring the deviation of the analog signal to an optimal range under normal operation. Thus, both in the calibration and the normal mode, the entire range of the digital input values of the converter DAC can be used, ensuring optimal operation in the two modes.

Figure 1:
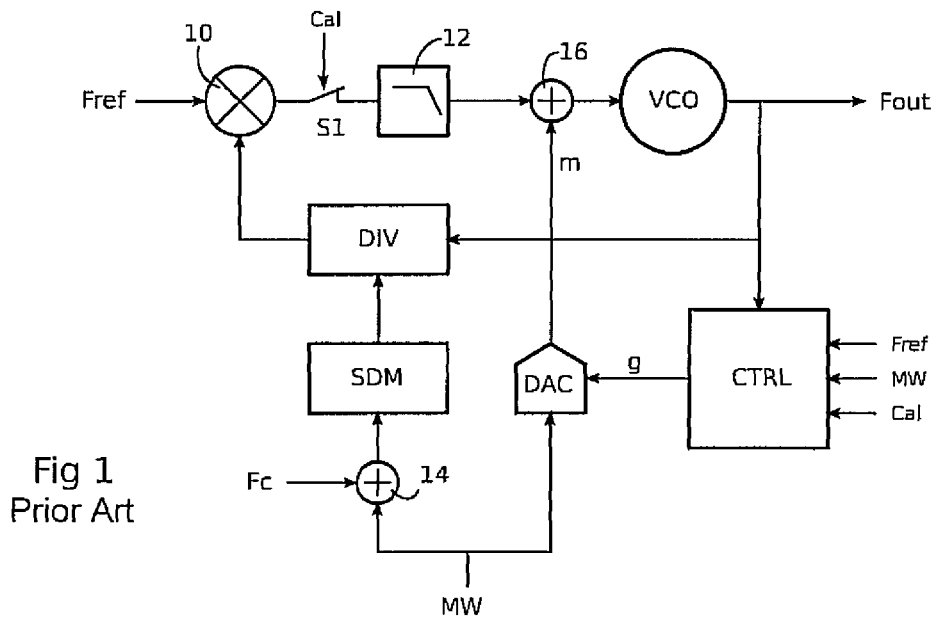
FIG. 1 schematically represents a classic double-point modulator, equipped with a gain calibration circuit in open loop in accordance with the prior art.
Figure 2:
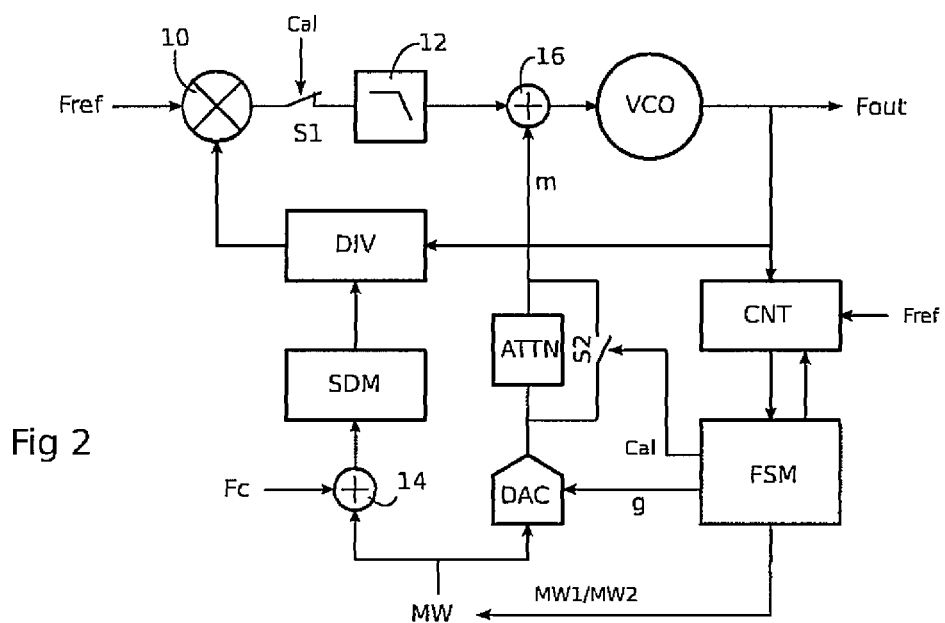
FIG. 2 is a schematic diagram of a double-point modulator offering an improved accuracy gain calibration in accordance with an embodiment of the present invention.

FIG. 2 schematically represents one embodiment of a double-point modulator incorporating these calibration elements. Elements similar to those in FIG. 1 are designated by the same references, and will not be described again. The abovementioned attenuator is designated ATTN and is placed between the output of the converter DAC and the adder 16. A selector switch S2 is connected to short-circuit the attenuator in the calibration mode, determined by the activation of the signal Cal. In this embodiment, switching is done between a direct modulation signal and an attenuated modulation signal. A strictly equivalent result is obtained by switching between a slightly attenuated signal and a more significantly attenuated signal.

The calibration is organized by a machine FSM. A counter CNT is connected to count pulses of the signal Fout in periods of the signal Fref.

The machine FSM determines the start of a calibration by activating the signal Cal. This puts the modulator into an open loop by opening the selector switch S1 and short-circuits the attenuator ATTN by closing the selector switch S2. The machine sets the initial gain of the converter DAC by the signal g, applies a first calibration value MW1 of the digital modulation signal, and prepares the counter CNT to count the pulses of the signal Fout. The count $N_1$ reached by the counter is stored by the machine at the end of the counting period. The machine then applies the second calibration value MW2 and prepares the counter for a new count. At the end of the new counting period, the machine stores the new count $N_2$ reached by the counter. The machine calculates and stores the gain to be used, applies it to the converter DAC, and switches the modulator to normal operating mode by deactivating the signal Cal. The selector switch S1 closes the loop and the selector switch S2 activates the attenuator ATTN at the output of the converter DAC.

According to an alternative embodiment, the counter CNT may be of a count/countdown type. It is put into the count mode for the first frequency and then into the countdown mode, without being reset, for the second frequency. At the end of the second counting period, the counter then includes the difference sought.

The oscillator VCO may be of an LC type with negative resistance, the frequency of which is set by two varactor paths. In this case, the adder 16 is removed. A first path receives the output of the filter 12 so as to set the central frequency, and the second path receives the output m of the converter DAC to perform the modulation.

Figure 3:
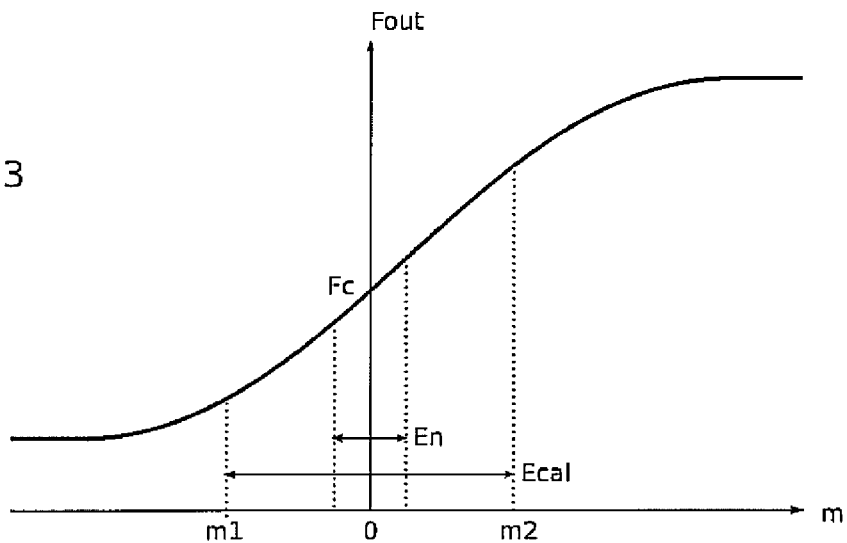
FIG. 3 is a graph showing the evolution of the frequency of the oscillator according to the modulation signal in accordance with the present invention.

FIG. 3 is a graph showing an example of evolution of the frequency of the oscillator VCO according to the signal m coming from the converter DAC. As shown, the frequency of the oscillator does not vary in a linear manner according to the modulation signal. It generally varies in an "S" shape and has a central part that can be considered linear. It is in this central part that the modulation and calibration are preferably performed.

In normal operation, the signal m has a low deviation En around 0. In the calibration mode, the signal m has a significant deviation Ecal around 0, between values m1 and m2, corresponding to the digital calibration values MW1 and MW2.

It can be seen that the curvature of the frequency response can induce an error in the gain calculation if the deviation Ecal is too high. As shown, the values m1 and m2 are preferably chosen to be symmetric in relation to 0 so that the estimation of the slope in the vicinity of zero obtained from points m1 and m2 is as accurate as possible.

Despite the fact that a rather significant amplitude of the deviation Ecal causes, in theory, a loss of accuracy in the gain calculation, in practice it transpires that this loss can be made insignificant compared to the gain in accuracy achieved on the frequency calculation. By choosing a high value for the deviation Ecal, which is optimum when it remains within the limits of the linear zone of the response curve, it is possible to obtain a difference in counted periods of the signal Fout such that the uncertainty of one unit on the count has an insignificant impact.

In an example of application, i.e. transmission according to the Bluetooth 4.0 Low Energy standard, the frequency Fref is 16 MHz and the carrier frequency varies in a band around 2.45 GHz. The oscillator VCO can be of LC type with two varactor modulation paths. The deviation Ecal is chosen to obtain a difference in frequencies in the order of 5 MHz, although the frequency band in normal use is 500 kHz, i.e. the ratio is chosen in the order of 10 between the calibration frequency band and the normal band. In this example of application, the attenuator ATTN has a ratio of 32. It will be understood that this ratio value depends on the gain of the oscillator used.

Figure 4:
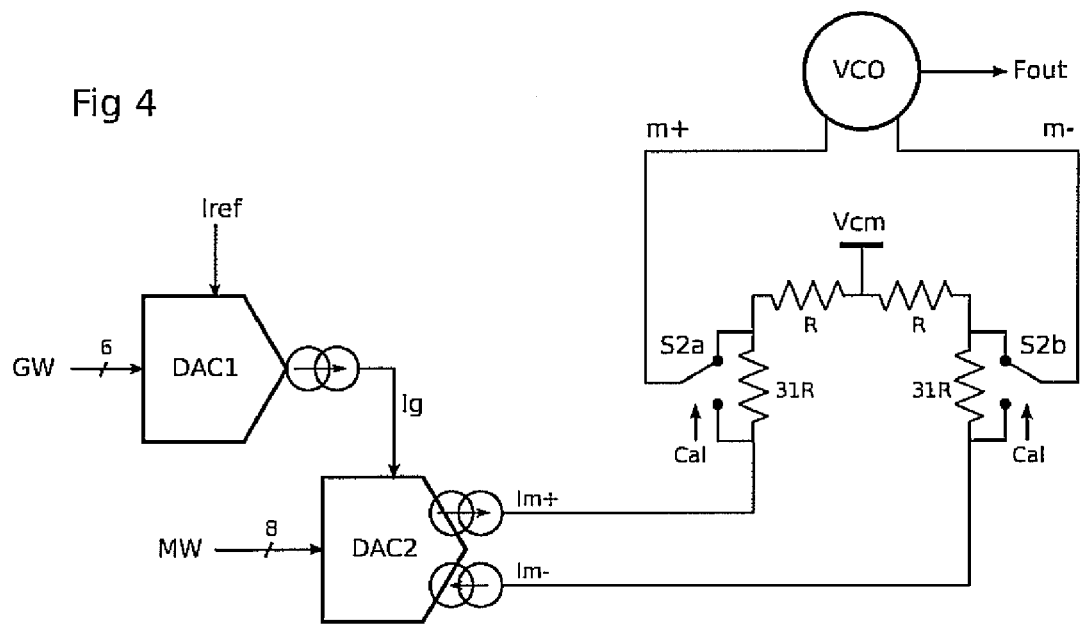
FIG. 4 schematically represents a detailed example of a gain-setting and attenuation circuit in accordance with the present invention.

FIG. 4 shows a detailed embodiment of the gain-setting and attenuation elements. The digital-to-analog converter in FIG. 2 comprises two converters in a current mode DAC1 and DAC2. The converter DAC1 is used to convert a digital gain setpoint GW (corresponding to the signal g in FIG. 2) into a current Ig that is used as a reference current (and thus for gain setting) for the converter DAC2. The converter DAC1 receives a constant reference current Iref. The converter DAC2 converts the digital modulation signal MW into a differential current (Im+, Im−), each component of which supplies a resistor bridge (31R, R) linked to a common mode voltage reference Vcm. These two resistor bridges form the attenuator ATTN for an oscillator VCO controlled by differential voltage. The selector switch S2 in FIG. 2 here includes two selector switches S2*a* and S2*b*.

In the normal mode, each selector switch S2*a* and S2*b* links a respective control terminal of the oscillator VCO to the intermediate node of the respective resistor bridge. The control voltage of the oscillator is attenuated according to the bridge ratio (it is proportional to R).

In the calibration mode, each selector switch S2*a*, S2*b* links the respective control terminal of the oscillator directly to the corresponding output of the converter DAC2. The control voltage of the oscillator is proportional to 32R.

The converter DAC1 is, for example, a 6-bit converter. It is preferably configured to work within a limited range of its output dynamics, which may correspond to the range strictly for setting the gain. This allows the resolution of the converter to be increased despite its low number of bits. For example, when in standby mode, for a minimum gain setpoint GW, it uses ⅔ of its dynamics. Thus, the output of the converter is expressed using the following formula:

$$Ig=[⅔+⅓(GW/64)]Iref.$$

The converter DAC2 is, for example, an 8-bit converter. Its positive differential output Im+ is proportional to Ig·MW/256, and its negative differential output Im− is proportional to (255/256−MW/256) Ig.

An alternative to using an increased gain digital-to-analog converter followed by an attenuator in the normal mode is to use a normal gain converter followed by an amplifier in the calibration mode. However, using an amplifier implies additional noise, consumption and complexity to using an attenuator in the form of a simple passive resistor bridge.

Another alternative is to apply a gain variation to the converter in the calibration mode. However, this option remains theoretical, as it is inconceivable in practice to produce a converter having optimum features with a gain variation of a factor 32.

That which is claimed:

1. A phase-locked loop double-point modulator comprising:
    a frequency divider having a division ratio configured to be changed based upon a first modulation signal;
    an oscillator having an operating frequency configured to be changed based upon a second modulation signal correlated to the first modulation signal;
    a calibration circuit configured, in a calibration mode, to match gains of the first and second modulation signals, based on frequency measurements of said oscillator in an open-loop configuration for two different calibration values of the second modulation signal;
    an attenuator having a ratio greater than 1 and placed in a path of the second modulation signal; and
    a selector switch configured to be controlled by said calibration circuit to reduce the ratio of the attenuator in the calibration mode.

2. The modulator according to claim 1, further comprising a digital-to-analog converter configured to produce an analog form of the second modulation signal from a digital form of the first modulation signal, and configured to produce an output deviation higher than a non-calibration operating mode deviation.

3. The modulator according to claim 2, wherein said attenuator has a ratio chosen to adjust the output deviation of the digital-to-analog converter to the non-calibration operating mode deviation.

4. The modulator according to claim 1, wherein said attenuator comprises a resistor bridge having an input and an intermediate point; and wherein said selector switch is coupled to said resistor bridge to sample the second modulation signal at the intermediate point in the non-calibration mode and to sample the second modulation signal at the input in the calibration mode.

5. A modulator comprising:
    a frequency divider configured to receive a first modulation signal;
    an oscillator configured to receive a second modulation signal;
    a calibration circuit configured, in a calibration mode, to adjust gains of the first and second modulation signals, based on frequency measurements of said oscillator in an open-loop configuration for a plurality of different values of the second modulation signal;

an attenuator having a ratio greater than 1 and configured to receive the second modulation signal; and a selector switch configured to reduce the ratio of the attenuator in the calibration mode based upon said calibration circuit.

6. The modulator according to claim 5, further comprising a digital-to-analog converter configured to produce an analog form of the second modulation signal from a digital form of the first modulation signal, and configured to produce an output deviation higher than a non-calibration operating mode deviation.

7. The modulator according to claim 6, wherein said attenuator has a ratio chosen to adjust the output deviation of the digital-to-analog converter to the non-calibration operating mode deviation.

8. The modulator according to claim 5, wherein said attenuator comprises a resistor bridge having an input and an intermediate point; and wherein said selector switch is coupled to said resistor bridge to sample the second modulation signal at the intermediate point in the non-calibration mode and to sample the second modulation signal at the input in the calibration mode.

9. A modulation method comprising:

providing a first modulation signal to a frequency divider;

providing a second modulation signal to an oscillator;

adjusting gains of the first and second modulation signals in a calibration mode, using a calibration circuit, based on frequency measurements of the oscillator in an open-loop configuration for a plurality of different values of the second modulation signal;

providing the second modulation signal to an attenuator having a ratio greater than 1; and reducing the ratio of the attenuator in the calibration mode based upon the calibration circuit using a selector switch.

10. The method according to claim 9, further comprising generating an analog form of the second modulation signal from a digital form of the first modulation signal using a digital-to-analog converter, and generating an output deviation higher than a non-calibration operating mode deviation using the digital-to-analog converter.

11. The method according to claim 10, wherein the attenuator has a ratio chosen to adjust the output deviation of the digital-to-analog converter to the non-calibration operating mode deviation.

12. The method according to claim 9, wherein the attenuator comprises a resistor bridge having an input and an intermediate point, and coupled to the selector switch; and further comprising sampling the second modulation signal at the intermediate point in the non-calibration mode and sampling the second modulation signal at the input in the calibration mode.

* * * * *